United States Patent
Seidel et al.

(10) Patent No.: US 7,903,480 B2
(45) Date of Patent: Mar. 8, 2011

(54) INTEGRATED CIRCUIT, AND METHOD FOR TRANSFERRING DATA

(75) Inventors: Konrad Seidel, Dresden (DE); Reinhard Ronneberger, Dresden (DE); Mario Wallisch, Dresden (DE)

(73) Assignee: Qimonda AG, Munich (DE)

( * ) Notice: Subject to any disclaimer, the term of this patent is extended or adjusted under 35 U.S.C. 154(b) by 260 days.

(21) Appl. No.: 12/023,592

(22) Filed: Jan. 31, 2008

(65) Prior Publication Data

US 2009/0196110 A1   Aug. 6, 2009

(51) Int. Cl.
*G11C 7/10* (2006.01)

(52) U.S. Cl. ............... 365/189.17; 365/149; 365/189.18; 365/189.05; 365/189.12; 365/230.08

(58) Field of Classification Search ............ 365/185.07, 365/185.25, 149, 189.17, 189.18, 189.05, 365/189.12, 203, 230.08
See application file for complete search history.

(56) References Cited

U.S. PATENT DOCUMENTS

| | | | | |
|---|---|---|---|---|
| 5,889,893 | A * | 3/1999 | Robson | 382/296 |
| 7,260,002 | B2 * | 8/2007 | Choi et al. | 365/196 |
| 7,639,530 | B2 * | 12/2009 | Mihnea | 365/185.03 |
| 7,672,166 | B2 * | 3/2010 | Park et al. | 365/203 |
| 2007/0183234 | A1 * | 8/2007 | Han et al. | 365/203 |
| 2007/0274122 | A1 * | 11/2007 | Kim et al. | 365/149 |
| 2009/0193295 | A1 * | 7/2009 | Drost et al. | 714/32 |

* cited by examiner

*Primary Examiner* — Hoai V Ho
*Assistant Examiner* — Fernando N Hidalgo
(74) *Attorney, Agent, or Firm* — Dicke, Billig & Czaja, PLLC

(57) ABSTRACT

An integrated circuit and a method for transferring data is provided. One embodiment provides a method for transferring data in an integrated circuit. The method includes driving a first line in accordance with data to be transferred. The data is transmitted from the first line to a second line based on a capacitive coupling.

13 Claims, 4 Drawing Sheets

US 7,903,480 B2

INTEGRATED CIRCUIT, AND METHOD FOR TRANSFERRING DATA

BACKGROUND

The present invention relates generally to an integrated circuit, an electronic system, and a method for transferring data.

In conventional integrated circuits such as microcontrollers, microprocessors, memory components (e.g., PLAs, PALs, ROMs, PROMs, EPROMs, EEPROMs, Flash memories, RAMs, etc.) data is transferred along respective lines provided in the integrated circuits.

A RAM memory component (RAM=Random Access Memory) is a memory device in which data can be stored under a respective address, and from which the data can later be read out again under this address.

The memory cells of a RAM memory component are connected to bit lines which serve to transmit data read out from a respective memory cell or data to be read into the memory cell.

Because a RAM memory component needs to be provided with as many memory cells as possible, it becomes important for the creation of these cells to be kept as simple as possible.

With SRAMs (SRAM=Static Random Access Memory) the individual memory cells for instance consist of a few, e.g., six, transistors, and with DRAMs (DRAM=Dynamic Random Access Memory) usually of only a single suitably controlled capacitive element (e.g., the gate-source capacitance of a MOSFET), with the capacitance of which one bit can be stored in the form of charge.

However, this charge only persists for a short period, which means that a "refresh" must be performed regularly. In contrast to this, SRAMs do not need a "refresh" to be performed on them; i.e., the data stored in a memory cell persists for as long as the SRAM is provided with an appropriate voltage supply.

In NVM memory components (NVM=non-volatile memory), e.g., ROMs, PROMs, EPROMs, EEPROMs, and Flash memories in contrast the stored data persists even when the supply voltage is switched off.

A Flash memory/flash EEPROM represents a hybrid between an EPROM and an EEPROM. A flash EEPROM is a multi-programmable read only memory component, which— similar to an EEPROM—is electrically erasable, in general not however bit by bit, or byte by bite, but rather e.g.,— correspondingly similar to an EPROM—in its entirety.

In conventional Flash memories, each memory cell includes a transistor with a control gate, a source and a drain. The memory cells are arranged in rows and columns, each row typically associated with a respective word line, and each column typically associated with a respective bit line.

A Flash memory cell can be programmed by biasing the control gate to a relatively high voltage ("programming voltage"), thus raising the threshold voltage Vt of the respective transistor. Once programmed, the transistor retains the raised threshold voltage. Further, a Flash memory cell can be read by applying a read voltage to the control gate, typically via a word line, and by applying a positive bias to the drain, typically via a bit line. The read voltage is a voltage below the threshold voltage Vt of a programmed transistor, and above the threshold voltage Vt of an erased or unprogrammed transistor. Thus, if the transistor is programmed, the transistor will be "off", and not conduct drain current, and if the transistor is erased or unprogrammed, the transistor will be "on" and conduct drain current.

As becomes clear from the above, in conventional integrated circuits such as microcontrollers, microprocessors, memory components, data only is transferred along respective lines provided in the integrated circuits (e.g., along the bit lines of RAM memory components, Flash memories, etc.).

SUMMARY

Embodiments of the invention relate to an integrated circuit, an electronic system, and a method for transferring data. According to one embodiment, a method for transferring data in an integrated circuit is provided. The method may comprise: driving a first line in accordance with data to be transferred; and transmitting the data from the first line to a second line based on a capacitive coupling between the first line and the second line.

Further features and advantages of the present invention will become apparent from the following detailed description of the invention made with reference to the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
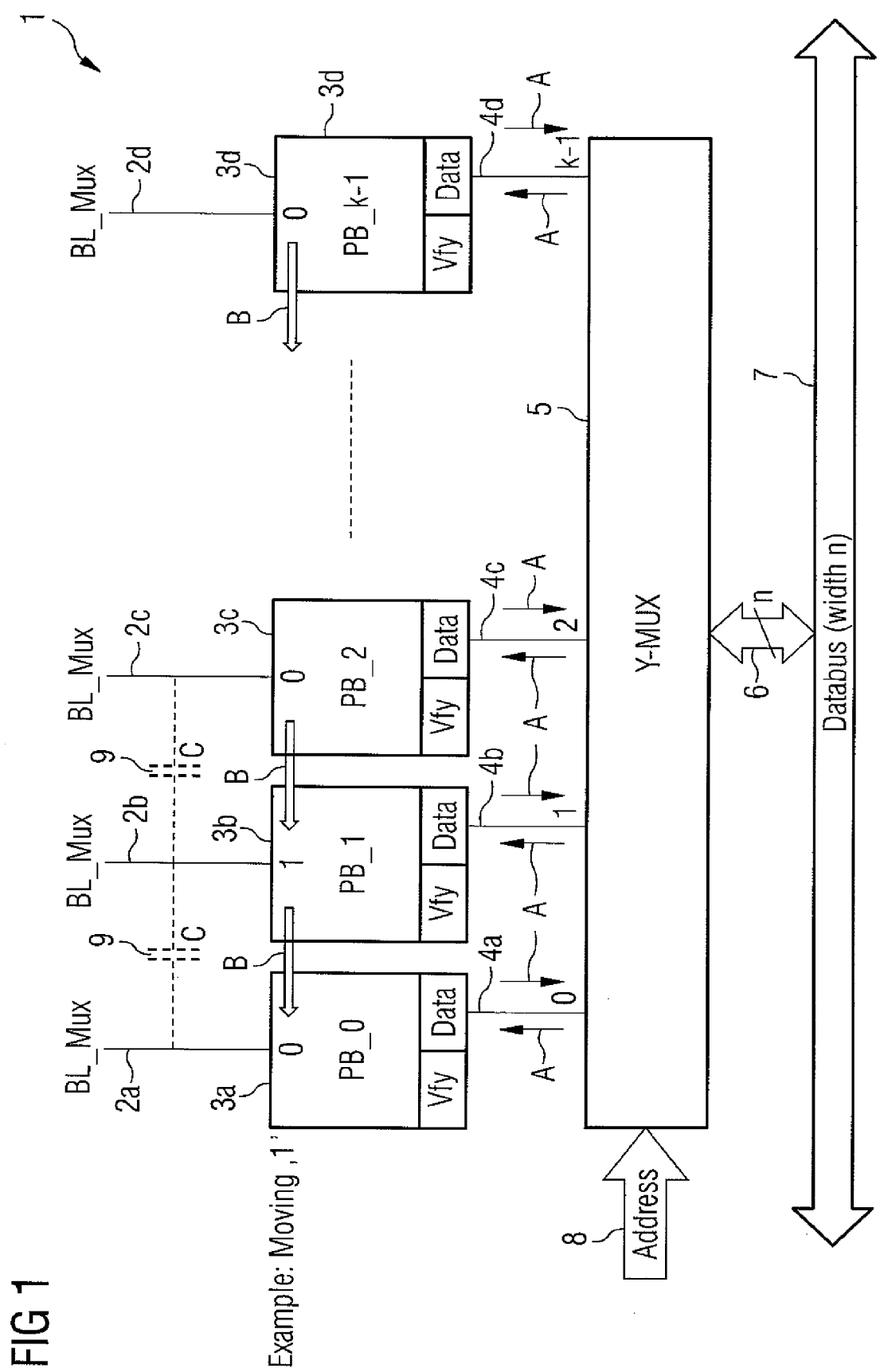
FIG. 1 illustrates a schematic, exemplary view of an exemplary section of an integrated circuit, e.g., a Flash memory where a method for transferring data according to one embodiment can be applied.
Figure 6:
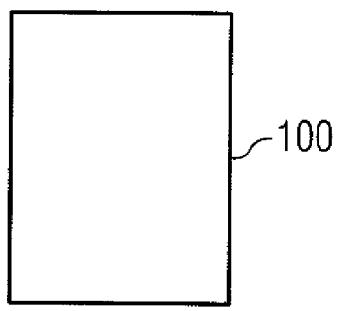
FIG. 6 illustrates an exemplary view of an integrated circuit where a method for transferring data according to one embodiment can be applied.

FIG. 1 illustrates a schematic exemplary view of an exemplary section 1 of an integrated circuit 100 where a method for transferring data according to one embodiment can be applied. The integrated circuit 100 e.g., is illustrated in FIG. 6.

In accordance with the present embodiment, the integrated circuit 100 may e.g., be a microcontroller, a microprocessor, a memory component (e.g., a PLA, a PAL, a ROM, a PROM, an EPROM, an EEPROM, a Flash memory, a RAM (e.g., a DRAM or SRAM), etc.), or any other suitable integrated circuit.

The integrated circuit 100 may e.g., be arranged on a respective semiconductor chip.

For instance, the integrated circuit may be a memory component, e.g., a Flash memory, or e.g., a RAM, including a plurality of memory cells.

The memory cells e.g., may be arranged in rows and columns.

Each row of memory cells may be associated with a respective word line, and each column of memory cells may be associated with a respective bit line/pair of bit lines 2a, 2b, 2c, 2d.

In the case of a Flash memory, each of the above memory cells may e.g., include a transistor, e.g., an EEPROM transistor/flash-(storage-)cell transistor/flash-storage-transistor with a control gate, a source and a drain.

Further, in the case of an SRAM, each of the above memory cells may e.g., include a few, e.g., six, transistors, and in the case of a DRAM, each of the above memory cells may e.g., include only a single suitably controlled capacitive element (e.g., the gate-source capacitance of a MOSFET).

In the case of a Flash memory, each of the memory cells may be programmed by biasing the control gate of a respective EEPROM transistor to a relatively high voltage ("programming voltage"), thus raising the threshold voltage Vt of the respective EEPROM transistor.

Further, in the case of a Flash memory, each of the memory cells may be read by applying a read voltage to the control gate, typically via a word line, and by applying a positive bias to the drain, typically via a bit line 2a, 2b, 2c, 2d. The read voltage may be a voltage below the threshold voltage Vt of a programmed transistor, and above the threshold voltage Vt of an erased or unprogrammed transistor.

For instance, in the case of a Flash memory, a source-drain path of a first EEPROM transistor of a first column of memory cells may be connected to a first bit line 2a of the above bit lines 2a, 2b, 2c, 2d, and to a source-drain path of a second EEPROM transistor of the first column of memory cells. The source-drain path of the second EEPROM transistor of the first column of memory cells may—in addition to the source-drain path of the first EEPROM transistor of the first column of memory cells—be connected to a source-drain path of a third EEPROM transistor of the first column of memory cells. Correspondingly similar, the source-drain path of the third EEPROM transistor of the first column of memory cells may—in addition to the source-drain path of the second EEPROM transistor of the first column of memory cells—be connected to a source-drain path of a fourth EEPROM transistor of the first column of memory cells, etc., etc. Finally, a source-drain path of an $i^{th}$ EEPROM transistor of the first column of memory cells may be connected to a source-drain path of an $(i-1)^{th}$ EEPROM transistor of the first column of memory cells, and may—in addition—be connected to ground.

Further, each control gate of the EEPROM transistors of the first column of memory cells may be connected to a different one of the above word lines.

For instance, the control gate of the first EEPROM transistor of the first column of memory cells may be connected to a first word line, the control gate of the second EEPROM transistor of the first column of memory cells may be connected to a second word line, etc., etc.

Hence, the EEPROM transistors of the first column of memory cells form a respective conventional NAND string of memory cells.

The further columns of memory cells, e.g., a second and a third, etc. column of memory cells may be arranged similarly as explained above for the first column of memory cells.

For instance, a source-drain path of a first EEPROM transistor of a second column of memory cells may be connected to a second bit line 2b of the above bit lines 2a, 2b, 2c, 2d, and to a source-drain path of a second EEPROM transistor of the second column of memory cells. The source-drain path of the second EEPROM transistor of the second column of memory cells may—in addition to the source-drain path of the first EEPROM transistor of the second column of memory cells—be connected to a source-drain path of a third EEPROM transistor of the second column of memory cells, etc.

Further, the control gate of the first EEPROM transistor of the second column of memory cells may be connected to the above first word line, the control gate of the second EEPROM transistor of the second column of memory cells may be connected to the above second word line, etc., etc.

Hence, the EEPROM transistors of the second and further columns of memory cells also form respective conventional NAND strings of memory cells.

As is illustrated in FIG. 1, similar as in conventional Flash memories, the first bit line 2a—in addition to the above source-drain path of the first EEPROM transistor of the first column of memory cells—is connected to a first buffer 3a (page buffer 3a).

Correspondingly similar, the second bit line 2b—in addition to the above source-drain path of the first EEPROM transistor of the second column of memory cells—is connected to a second buffer 3b (page buffer 3b).

Further, a third bit line 2c—in addition to a source-drain path of a first EEPROM transistor of a third column of memory cells—is connected to a third buffer 3c (page buffer 3c), etc., etc., and a $(k-1)^{th}$ bit line 2d—in addition to a source-drain path of a first EEPROM transistor of a $(k-1)^{th}$ column of memory cells—is connected to a $(k-1)^{th}$ buffer 3d (page buffer 3d).

The buffers 3a, 3b, 3c, 3d each may include one or several latches. For instance, each buffer 3a, 3b, 3c, 3d may include an "L"-latch ("left") latch, and an "R"-latch ("right") latch, coupled to the respective L-latch.

As is illustrated in FIG. 1, the first buffer 3a is connected via a corresponding first bidirectional data line 4a to a decoder 5 (here: a respective Y-MUX decoder 5). Correspondingly similar, the second buffer 3b is connected to the decoder 5 via a second bidirectional line 4b, the third buffer 3c is connected to the decoder 5 via a third bidirectional line 4c, etc., etc., and the $(k-1)^{th}$ buffer 3d is connected to the decoder 5 via a $(k-1)^{th}$ bidirectional line 4d.

As is further illustrated in FIG. 1, the decoder 5 is connected via n bidirectional lines 6 to a bus 7, here: an internal data bus having a width of n.

The number n (i.e., the number of lines 6/the width of the internal data bus) may be smaller than the number k (i.e., the number of lines 4a, 4b, 4c, 4d/the page buffer width/the number of bit lines/pair of bit lines 2a, 2b, 2c, 2d). For instance, the page buffer width k may e.g., be between 1 k and 128 k, e.g., between 8 k and 64 k, and the width n of the internal data bus 7 may e.g., be between 1 and 128 Bits, e.g., between 8 and 64 Bits, or any other suitable number.

Depending on respective address/control bits applied via respective address/control lines 8 to the decoder 5, a respective line of the bus 7 is either connected to the above first bidirectional line 4a (i.e., a bidirectional line/page buffer associated with a first page of memory cells), or the above second bidirectional line 4b (i.e., a bidirectional line/page buffer associated with a second page of memory cells), or the above third bidirectional line 4c (i.e., a bidirectional line/page buffer associated with a third page of memory cells), etc., etc. Hence, the actual page selection (i.e., which memory cells of e.g., n different pages of memory cells are actually be written or read) is done via the address/control bits applied at the address/control lines 8.

In a first operating mode of the Flash memory, to perform a write operation, the respective data bit (either a logic "0", or a logic "1") to be written into a respective memory cell first is applied at a respective line of the above internal data bus 7, and then via the bidirectional line 4a, 4b, 4c, 4d as selected by the respective address/control bits applied at the address/control lines 8 is transferred to the buffer 3a, 3b, 3c, 3d associated with the respective selected bidirectional line 4a, 4b, 4c, 4d, and stored therein. Thereafter, the data bit ("0", or "1") stored in the respective buffer 3a, 3b, 3c, 3d via the bit line 2a, 2b, 2c, 2d associated with the respective buffer 3a, 3b, 3c, 3d may in a conventional way be written into the respective memory cell.

Correspondingly similar, in the above first operating mode of the Flash memory, a data bit (either a logic "0", or a logic "1") read from a respective memory cell may first via the respective bit line 2a, 2b, 2c, 2d associated with the read memory cell be transferred to the buffer 3a, 3b, 3c, 3d associated with the respective bit line 2a, 2b, 2c, 2d, and stored therein. Thereafter, the data bit ("0", or "1") stored in the respective buffer 3a, 3b, 3c, 3d may via the respective bidirectional line 4a, 4b, 4c, 4d as selected by the respective address/control bits applied at the address/control lines 8 be transferred to the line of the internal data bus 7 associated with the respective bidirectional line 4a, 4b, 4c, 4d.

Hence, in the above first operating mode, as in conventional integrated circuits, data is transferred along respective lines provided in the Flash memory (e.g., along the lines of the bus 7, along the bit lines 2a, 2b, 2c, 2d, along the bidirectional lines 4a, 4b, 4c, 4d (as illustrated by respective arrows A in FIG. 1), etc.).

In contrast, in a second operating mode of the Flash memory, and as will be described in more detail below with respect to FIGS. 1 and 2, data may also be transmitted in directions others than along the lines provided in the Flash memory/integrated circuit, e.g., in a direction angled with respect to the lines, for instance, in a direction substantially perpendicular to the bit lines 2a, 2b, 2c, 2d/lines 22a, 22b, 22c (as illustrated by respective arrows B in FIGS. 1 and 2), or any other suitable direction.

Figure 2:
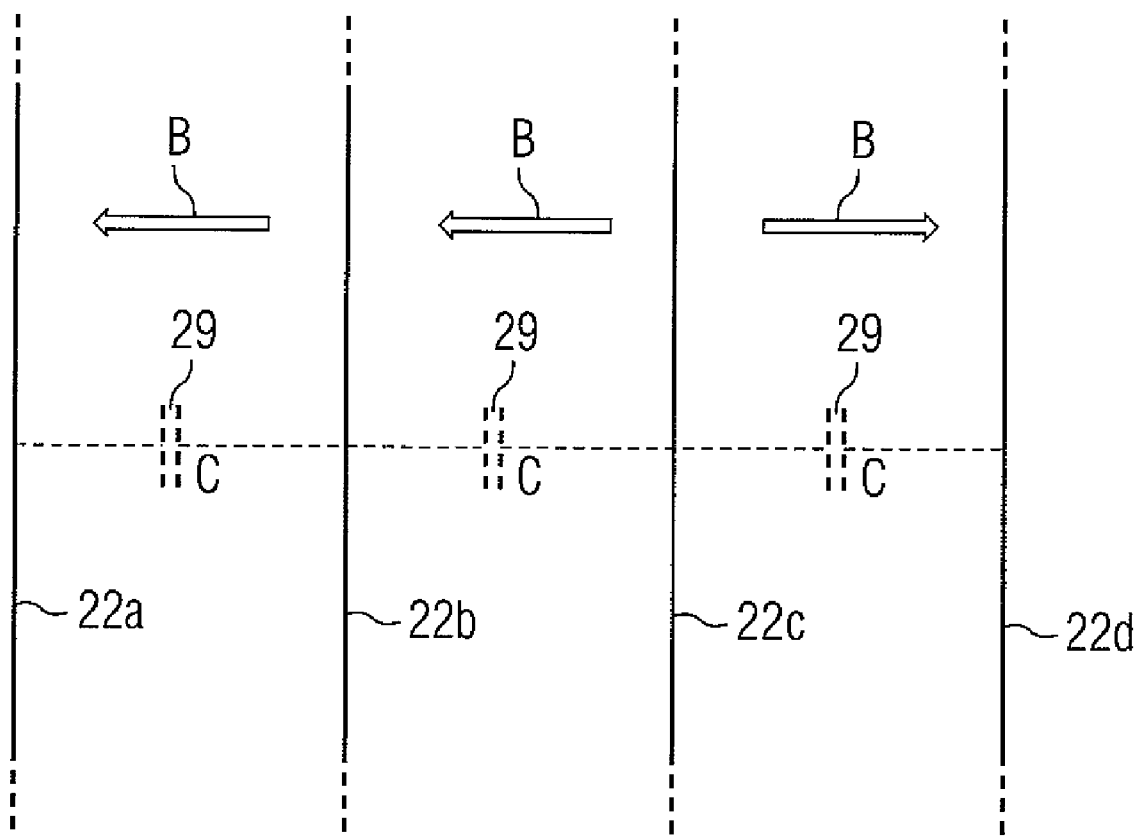
FIG. 2 illustrates a schematic, exemplary view of several adjacent lines in an integrated circuit, for illustrating a method for transferring data according to one embodiment.

For this purpose, parasitic coupling effects between adjacent lines are made use of (as illustrated by inherent coupling capacitances 9, 29 (capacitances C) present between adjacent lines 2a, 2b, 2c, and 22a, 22b, 22c, respectively, and illustrated in a dashed way in FIGS. 1 and 2).

Figure 5:
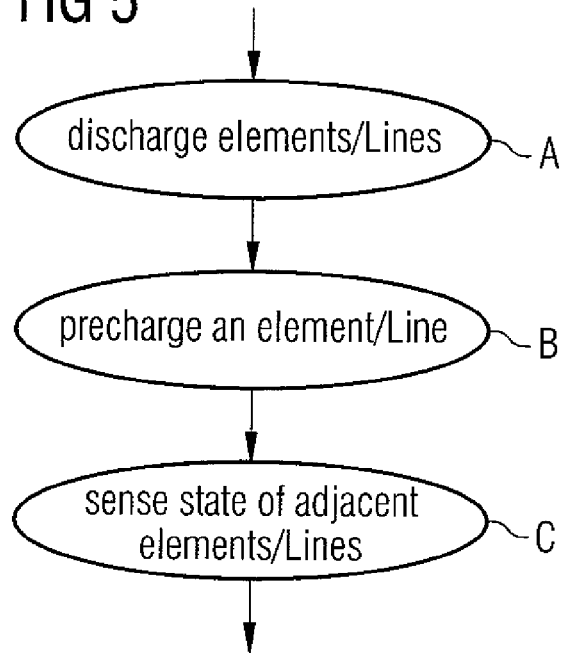
FIG. 5 illustrates a schematic, exemplary view of a flow diagram illustrating processes that may be performed in a method for transferring data according to one embodiment.

For instance, for transferring data in a direction other than along respective lines, first, the line in question (for instance, the line 22c as illustrated in FIG. 2), and lines adjacent to that line 22c (e.g., lines 22b, 22d to the left and to the right of the line 22c) may all be discharged (see e.g., step A according to the flow diagram illustrated in FIG. 5). Then, the line 22c in question may be precharged/driven in accordance with the respective data bit (a logic "0", or a logic "1") to be transferred, whilst the lines 22b, 22d adjacent to that line 22c (e.g., lines 22b, 22d to the left and to the right of the line 22c) are in a floating state (see e.g., step B according to the flow diagram illustrated in FIG. 5). Thus, due to the above coupling between the line 22c, and the line 22b (see the above capacitance 29), the line 22b to the left of the line 22c is induced, i.e., brought to a state corresponding to that of the line 22c (i.e., logic "0", or logic "1", in accordance with the respective data bit to be transferred). In addition, also the line 22d to the right of the line 22c is induced, i.e., also brought to a state corresponding to that of the line 22c (i.e., logic "0", or logic "1", in accordance with the respective data bit to be transferred). Thereafter, the state of the lines 22b, 22d may be sensed and amplified (see e.g., step C according to the flow diagram illustrated in FIG. 5).

Hence, the data is transferred in a direction substantially perpendicular to the line 22c, in one embodiment, as illustrated in FIG. 2, is transferred from the line 22c to the line 22b, and from the line 22c to the line 22d (as illustrated by respective arrows B).

The above method for transferring data based on coupling effects may not only be used to transfer data between adjacent lines, but between any conceivable capacitively coupled elements or groups of elements of a respective integrated circuit, e.g., a respective microcontroller, microprocessor, memory component, etc. For instance, as illustrated in FIG. 4, the method may be used to transfer data between respective ball-shaped elements (or flat round elements) 102a, 102b, 102c, 102d of an integrated circuit, between which a respective capacitive coupling exists (see capacitances 29), or between elements or groups of any other conceivable shape (e.g., respective oval or rectangular elements, etc.) or design, etc.

Figure 4:
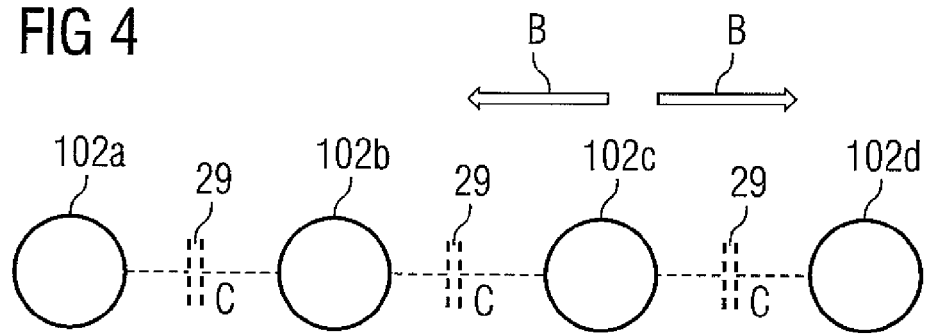
FIG. 4 illustrates a schematic, exemplary view of several capacitively coupled elements in an integrated circuit, for illustrating a method for transferring data according to one embodiment.

For instance, for transferring data in a direction B as illustrated in FIG. 4, first, the element in question (for instance, the element 102c as illustrated in FIG. 2), and elements adjacent to that element 102c (e.g., elements 102b, 102d to the left and to the right of the element 102c) may all be discharged. Then, the element 102c in question may be precharged/driven in accordance with the respective data bit (a logic "0", or a logic "1") to be transferred, whilst the elements 102b, 102d adjacent to that element 102c are in a floating state. Thus, due to the above coupling between the element 102c, and the element 102b (see the above capacitance 29), the element 102b is induced, i.e., brought to a state corresponding to that of the element 102c (i.e., logic "0", or logic "1", in accordance with the respective data bit to be transferred). In addition, also the element 102d is induced, i.e., also brought to a state corresponding to that of the element 102c (i.e., logic "0", or logic "1", in accordance with the respective data bit to be transferred). Thereafter, the state of the elements 102b, 102d may be sensed and amplified. Hence, the data is transferred in a direction as illustrated by respective arrows B in FIG. 4.

Figure 3:
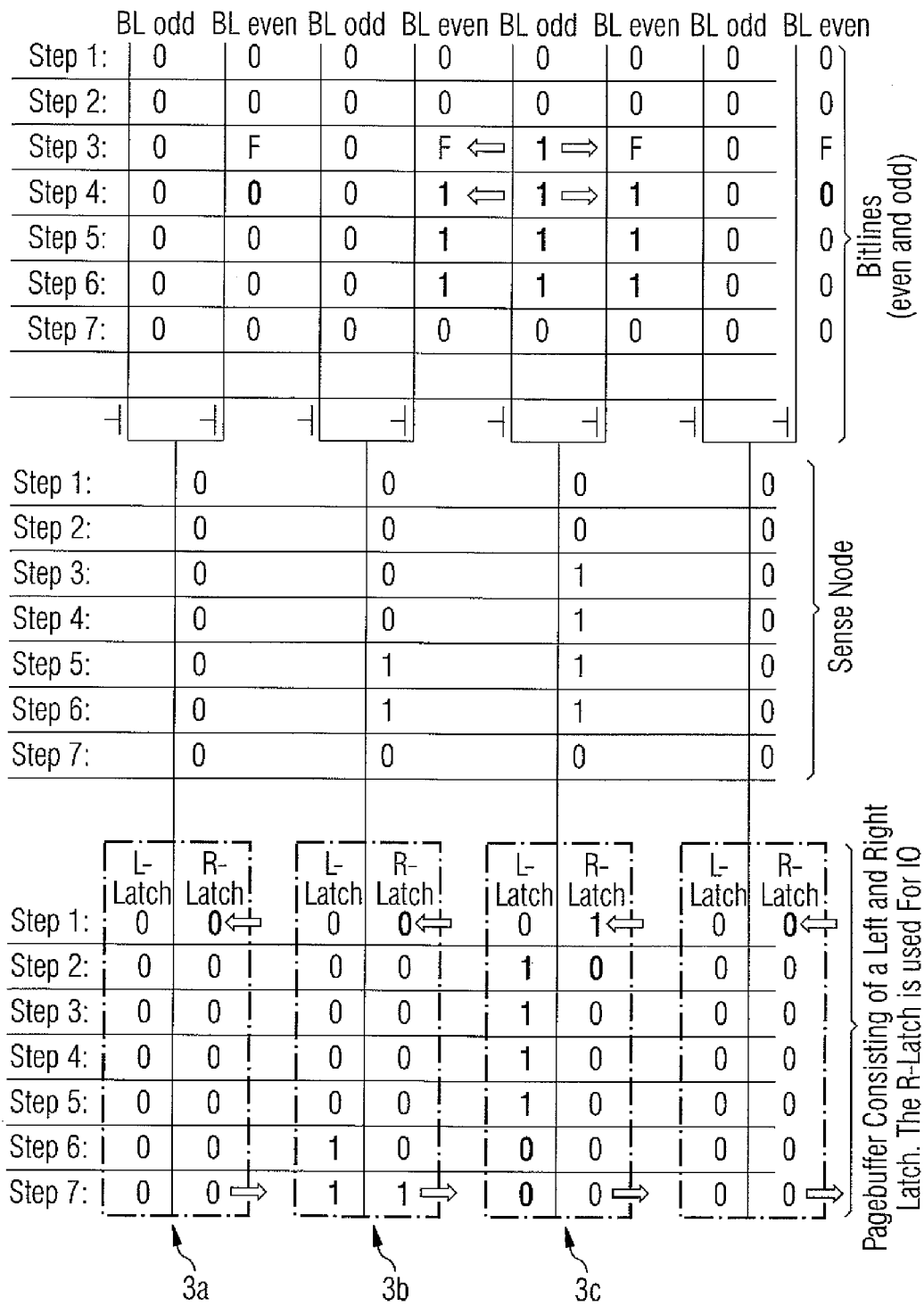
FIG. 3 illustrates a schematic, exemplary illustration of the states of bit lines, sense nodes, and L- and R-Latches of a Flash memory when transferring data according to one embodiment.

Again referring to FIG. 1, in the above second operating mode of the Flash memory, for transferring data in accordance with an embodiment of the invention, for instance, in a first step, a respective data bit (either a logic "0", or a logic "1") may be applied at a respective line of the above internal data bus 7, and then via the bidirectional line 4a, 4b, 4c, 4d as selected by the respective address/control bits applied at the address/control lines 8 may be transferred to the buffer 3a, 3b, 3c, 3d associated with the respective selected bidirectional line 4a, 4b, 4c, 4d (in one embodiment, to the respective R-latch), and stored therein. Thus, for instance, as illustrated in FIG. 3, first a logic "1" (or a logic "0") may be transferred to e.g., the R-latch of the buffer 3c, and stored therein. Further, the bit line/bit lines associated with the initialized buffer 3c (e.g., the bit line 2c), and neighboring bit lines, or all bit lines may be discharged.

Then, in a second step, and as also illustrated in FIG. 3, the data bit stored in the R-latch of the buffer 3c is copied/transferred to the L-latch of the buffer 3c.

Thereafter, in a third step, a bit line 2c associated with the buffer 3c may be precharged/driven in accordance with the respective data bit (a logic "0", or a logic "1") stored in the buffer's L-latch, whilst the bit lines adjacent to the bit line 2c (e.g., bit lines to the left and to the right of the bit line 2c) are floating. For instance, if the above bit line 2c associated with and driven by the L-latch of the buffer 3c is an "odd" bit line, all "odd" bit lines may be driven by their respective buffers, and all "even" bit lines instead may be left floating. If in contrast the bit line 2c associated with and driven by the buffer 3c (in one embodiment, the buffer's L-latch) is an "even" bit line, all "even" bit lines may be driven by their respective buffers, and all "odd" bit lines instead may be left floating.

Due to the precharging/driving of the bit line 2c, the floating state of the adjacent bit lines, etc., and the above coupling between the bit line 2c, and the adjacent bit lines, etc. (see the above capacitance 9), the bit lines 2b, etc. adjacent the bit line 2c (here: the bit lines 2b, etc. directly to the left and to the right of the bit line 2c) are induced, i.e., brought to a state corresponding to that of the bit line 2c (i.e., logic "0", or logic "1", in accordance with the respective data bit driven by the L-latch of the buffer 3c) (fourth step). Thereafter, in a fifth step, the state of the of bit lines 2b, etc. adjacent the bit line 2c may be sensed and amplified, e.g., by reading the state of the bit lines 2b into the associated sense nodes. For instance, if the bit line 2c associated with the buffer 3c is an "odd" bit line, all "even" bit lines (e.g., the bit lines 2b, 2d, etc.) may be sensed/read into the respective sense nodes. If in contrast the bit line 2c associated with the buffer 3c is an "even" bit line, all "odd" bit lines may be sensed/read into the respective sense nodes.

Further, in a subsequent sixth step, a XOR-operation may be performed. For instance, the sense node associated with the bit line 2b to the left of the above bit line 2c may be "XOR"-ed with the associated L-Latch (i.e., the L-latch of the page buffer 3b). Further, the sense node associated with the bit line to the right of the above bit line 2c may also be "XOR"-ed with the associated L-Latch (i.e., the L-latch of the respective associated page buffer). Hence, e.g., if the bit line 2c is an "odd" bit line, the sense nodes of all "even" bit lines may be "XOR"-ed with L-latches of their respective page buffers 3b, 3d. If in contrast the bit line 2c is an "even" bit line, instead, the sense nodes of all "odd" bit lines may be "XOR"-ed with L-latches of their respective page buffers. As the above "XOR"-operation is a typical page buffer operation which also—similar as in conventional Flash memories—may be used for other purposes than described above, e.g., a respective program verify, no additional design structures are necessary for carrying out the above data transfer process.

After carrying out the above processes, in an optional additional step, the data bit then stored in the respective L-latch of the respective buffer, e.g., the buffer 3b to the left of the buffer 3c (and e.g., the buffer to the right of the buffer 3c, etc.) may be copied/transferred to the R-latch of the respective buffer 3b, etc., such as to allow an output of the data bit via the decoder 5, if appropriate.

Thereafter, optionally, again respective processes substantially corresponding to the above third to sixths processes, etc. might be performed, such as to further move the above data bit in the above direction substantially perpendicular to the bit lines 2a, 2b, 2c, 2c (as illustrated by the above arrows B in FIG. 1).

For instance, in a process corresponding to the above third step, the bit line 2b associated with the buffer 3b may be precharged/driven in accordance with the respective data bit (a logic "0", or a logic "1") now stored in the buffer's L-latch, whilst the bit line 2a adjacent to the bit line 2b (e.g., the bit line 2a to the left of the bit line 2b) is floating.

Due to the precharging/driving of the bit line 2b, the floating state of the adjacent bit line 2a, etc., and the coupling between the bit line 2b, and the adjacent bit line 2a (see the above capacitance 9), the bit line 2a adjacent the bit line 2b is induced, i.e., brought to a state corresponding to that of the bit line 2b (i.e., logic "0", or logic "1", in accordance with the respective data bit driven by the L-latch of the buffer 3b) (fourth step). Thereafter, in a process corresponding to the above fifth step, the state of the of bit line 2a adjacent the bit line 2b may be sensed and amplified, e.g., by reading the state of bit line 2a into the associated sense node.

Further, in a process corresponding to the above sixth step, a XOR-operation may be performed. For instance, the sense node associated with the bit line 2a to the left of the above bit line 2b may be "XOR"-ed with the associated L-Latch (i.e., the L-latch of the page buffer 3a), such as to store the data bit in the respective L-latch.

Afterwards, in an optional additional step, the data bit then stored in the respective L-latch of the respective buffer 3a may be copied to the R-latch of the buffer 3a, such as to allow an output of the data bit via the decoder 5, if appropriate, etc., etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for transferring data, comprising:
precharging or loading a first conductive element or group of elements in accordance with data to be transferred;
transmitting the data from the first conductive element or group of elements to a second conductive element or group of elements by capacitive coupling between the first and the second conductive element or group of elements;
bringing the second conductive element or group of elements into a floating state before transmitting the data from the first conductive element or group of elements to the second conductive element or group of elements by capacitive coupling;
transmitting the data from the second conductive element or group of elements to a third conductive element or group of elements by capacitive coupling between the second and the third conductive element or group of elements; and
bringing the third conductive element or group of elements into a floating state before transmitting the data from the second conductive element or group of elements to the third conductive element or group of elements by capacitive coupling.

2. The method of claim 1 further comprising discharging the first conductive element or group of elements before the precharging.

3. The method of claim 1 further comprising sensing and amplifying the state of the second conductive element or group of elements after transmitting the data.

4. A method for transferring data in an integrated memory circuit, comprising:
   driving a first bit line in accordance with data to be transferred;
   transmitting the data from the first bit line to a second bit line based on a capacitive coupling between the first bit line and the second bit line;
   bringing the second bit line into a floating state before transmitting the data;
   transmitting the data from the first bit line to a third bit line based on a capacitive coupling between the first bit line and the third bit line, the first bit line between the second bit line and the third bit line; and
   bringing the third bit line into a floating state before transmitting the data.

5. The method of claim 4, wherein the integrated memory circuit comprises a microcontroller or microprocessor.

6. The method of claim 4, wherein the integrated memory circuit comprises a RAM.

7. The method of claim 4, wherein the integrated memory circuit comprises a Flash memory.

8. The method of claim 7 comprising driving the first bit line by a buffer or latch associated with the first bit line.

9. The method of claim 8, wherein the buffer is a page buffer.

10. The method of claim 9 further comprising reading the state of the second bit line into a sense node.

11. The method of claim 10 further comprising XOR-ring the state of the sense node and a latched data value associated with the second bit line.

12. An integrated memory circuit comprising:
    a first bit line;
    a second bit line capacitively coupled with the first bit line;
    a driver for driving the first bit line in accordance with data to be transferred to transmit the data from the first bit line to the second bit line based on the capacitive coupling of the second bit line with the first bit line and for bringing the second bit line into a floating state before transmitting the data;
    a third bit line capacitively coupled with the first bit line, the first bit line between the second bit line and the third bit line,
    wherein the driver is for driving the first bit line in accordance with data to be transferred to transmit the data from the first bit line to the second bit line and the third bit line based on the capacitive coupling of the second bit line with the first bit line and the third bit line with the first bit line and for bringing the second bit line and the third bit line into a floating state before transmitting the data.

13. The integrated circuit of claim 12 configured in an electronic system.

* * * * *